United States Patent
Morioka

(10) Patent No.: US 7,421,631 B2
(45) Date of Patent: Sep. 2, 2008

(54) SEMICONDUCTOR DEVICE WITH TERMINATION RESISTOR CIRCUIT

(75) Inventor: Daisuke Morioka, Kanagawa (JP)

(73) Assignee: NEC Electronics Corporation, Kawasaki (JP)

( * ) Notice: Subject to any disclaimer, the term of this patent is extended or adjusted under 35 U.S.C. 154(b) by 294 days.

(21) Appl. No.: 11/288,250

(22) Filed: Nov. 29, 2005

(65) Prior Publication Data

US 2006/0107140 A1 May 18, 2006

(30) Foreign Application Priority Data

Feb. 12, 2004 (JP) ............................. 2004-350213

(51) Int. Cl.
*G01R 31/28* (2006.01)
*H03K 17/18* (2006.01)
(52) U.S. Cl. ........................................ 714/724; 326/30
(58) Field of Classification Search ................. 714/724; 326/3
See application file for complete search history.

(56) References Cited

U.S. PATENT DOCUMENTS 6,812,735 B1 * 11/2004 Pham ........................... 326/30
6,961,883 B2 * 11/2005 Tsuji ............................ 714/721
7,102,381 B2 * 9/2006 Chen et al. ..................... 326/30
7,193,431 B2 * 3/2007 Miyake et al. ................. 326/30
7,197,684 B2 * 3/2007 Fang et al. .................. 714/742
7,205,788 B1 * 4/2007 Wang et al. .................... 326/30

OTHER PUBLICATIONS

DDR-2 SDRAM Technology and Design Trends (DesignCon 2003), High Performance System Design Conference, 2003.

* cited by examiner

*Primary Examiner*—Phung M Chung
(74) *Attorney, Agent, or Firm*—McGinn IP Law Group, PLLC

(57) ABSTRACT

A semiconductor device includes a signal line, a test load circuit and a termination circuit. The signal line is connected with an input/output node of the semiconductor device. The test load circuit has a test resistor and is provided between the signal line and a first one of power lines to connect the signal line to the first power line through the test resistor in response to a test start signal. The termination circuit has first and second resistors, and is provided between the first power line and a second power line as the other power line to disconnect the signal line from the first and second power lines in response to the test start signal. Also, the test load circuit disconnects the signal line from the first power line in response to a test end signal, and the termination circuit connects the signal line with the first and second power lines through the first and second resistors in response to the test end signal.

20 Claims, 5 Drawing Sheets

SEMICONDUCTOR DEVICE WITH TERMINATION RESISTOR CIRCUIT

BACKGROUND OF THE INVENTION

1. Field of the Invention

The present invention relates to a semiconductor integrated circuit, and more particularly relates to a semiconductor integrated circuit having a termination resistor circuit.

2. Description of the Related Art

In association with the advancement of a semiconductor technology, a large-scaled LSI with a large number of input/output terminals has been manufactured. A manufactured LSI is tested by using an LSI tester in order to check whether the LSI operates normally. The LSI tester has test terminals, to which the input/output terminals of the LSI are connected.

Typically, the input/output terminals of the LSI include termination resistors. In particular, in the recent LSI, the termination resistors are employed on a chip, as shown in DDR-2 SDRAM Technology and Design Trends (DesignCon 2003). FIG. 1 is a circuit diagram showing the configuration of an input/output circuit configured in accordance with a DDR-2 standard. The input/output circuit has two sets of Thevenin termination resistors, which are low in resistance and different in resistor value (for example, 75Ω and 100Ω), on the basis of the characteristic impedance of a propagation line.

In the input/output circuit shown in FIG. 1, before the LSI test is started, a switch SW1 and a switch SW2 are opened. When the number of the input/output terminals of the LSI as a test target is small, all of the input/output terminals of the LSI can be connected to the test terminals. However, when the test target is the large-scaled LSI, there is a case where the number of the input/output terminals of the large-scaled LSI exceeds the number of the test terminals of the LSI tester. In this case, there are the input/output terminals which cannot be connected to the test terminals and cannot be controlled by the LSI tester. Therefore, it is necessary to carry out the LSI test over a plurality of times for all of the input/output terminals. The input/output terminals that are not connected to the test terminals are unstable in a signal level, when an input/output circuit is tested in an input mode. If any one of the Thevenin termination resistors of the set, e.g., a resistor Rvall on a Vss side in FIG. 1 is connected to the ground line in order to stabilize the signal level of the input/output terminal in the input mode, a large quantity of penetration current flows through that resistor of the input/output circuit in an output mode so that an consumption current is largely increased.

In order to eliminate the input/output terminals that are not connected to the test terminals on the test of the large-scaled LSI, the LSI tester must be prepared which has the test terminals for the number of the input/output terminals of the large-scaled LSI. However, the preparation of such an LSI tester requires a huge cost.

Therefore, a technique is demanded which can stabilize the signal levels of the input/output terminals in the input mode and decrease the penetration current in the output mode, even if there is any input/output terminal that is not connected to the test terminals of the LSI tester, when the LSI test is carried out.

SUMMARY OF THE INVENTION

In an aspect of the present invention, a semiconductor device includes a signal line, a test load circuit and a termination circuit. The signal line is connected with an input/output node of the semiconductor device. The test load circuit has a test resistor and is provided between the signal line and a first one of power lines to connect the signal line to the first power line through the test resistor in response to a test start signal. The termination circuit has first and second resistors, and is provided between the first power line and a second power line as the other power line to disconnect the signal line from the first and second power lines in response to the test start signal.

Also, the test load circuit disconnects the signal line from the first power line in response to a test end signal, and the termination circuit connects the signal line with the first and second power lines through the first and second resistors in response to the test end signal.

The semiconductor device may further include a control circuit configured to set a test mode in response to a test start command to generate the test start signal, and to set a normal mode in response to a test end command to generate the test end signal. In this case, the resistance of the test resistor is preferably larger than that of each of the first and second resistors.

Also, the resistance of the test resistor may be determined based on a level of a signal supplied onto the signal line. In this case, the semiconductor device may further include an input/output buffer circuit, and the input/output buffer circuit outputs the signal from an external unit onto the signal line and outputs a signal onto the signal line to the external unit in the test mode.

Also, the test load circuit may include the test resistor; and a test switch configured to connect the signal line to the first power line through the test resistor in response to the test start signal.

Also, the termination circuit may include the first and second resistors; a first switch configured to connect the signal line to the first power line through the first resistor in response to the test start signal, and to disconnect the signal line from the first power line in response to the test end signal; and a second switch configured to connect the signal line to the second power line through the second resistor in response to the test start signal, and to disconnect the signal line from the second power line in response to the test end signal.

In another aspect of the present invention, a method of testing a semiconductor device, is achieved by (a) connecting a signal line, which is connected with an input/output node of the semiconductor device, to a first one of power lines through a test resistor of a test load circuit in response to a test start signal; and by (b) disconnecting the signal line from the first power line and a second power line as the other power line by a termination circuit having first and second resistors, in response to the test start signal.

Also, the method may be achieved by further
(c) disconnecting the signal line from the first power line in response to a test end signal; and (d) connecting the signal line with the first and second power lines through the first and second resistors in response to the test end signal, respectively.

Here, the method may be achieved by further setting a test mode and generating the test start signal in response to a test start command; and setting a normal mode and generating the test end signal in response to a test end command.

Also, the resistance of the test resistor is preferably larger than that of each of the first and second resistors.

Also, the resistance of the test resistor may be determined based on a level of a signal supplied onto the signal line.

Also, the method may be achieved by further outputting the signal from an external unit onto the signal line through an input/output buffer circuit in the test mode; and outputting a signal onto the signal line the to the external unit through the input/output buffer circuit in the test mode.

Also, the (a) connecting may be achieved by closing a test switch provided between the signal line and the first power line in response to the test start signal, and the (c) disconnecting may be achieved by opening the test switch in response to the test end signal.

Also, the (b) disconnecting may be achieved by opening a first switch provided between the signal line and the first power line and a second switch provided between the signal line and the second power line in response to the test start signal, and the (b) connecting may be achieved by closing the first switch and the second switch in response to the test end signal.

DESCRIPTION OF THE PREFERRED EMBODIMENTS

Hereinafter, a semiconductor device such as an LSI with an input/output circuit according to the present invention will be described with reference to the attached drawings.

Figure 2:
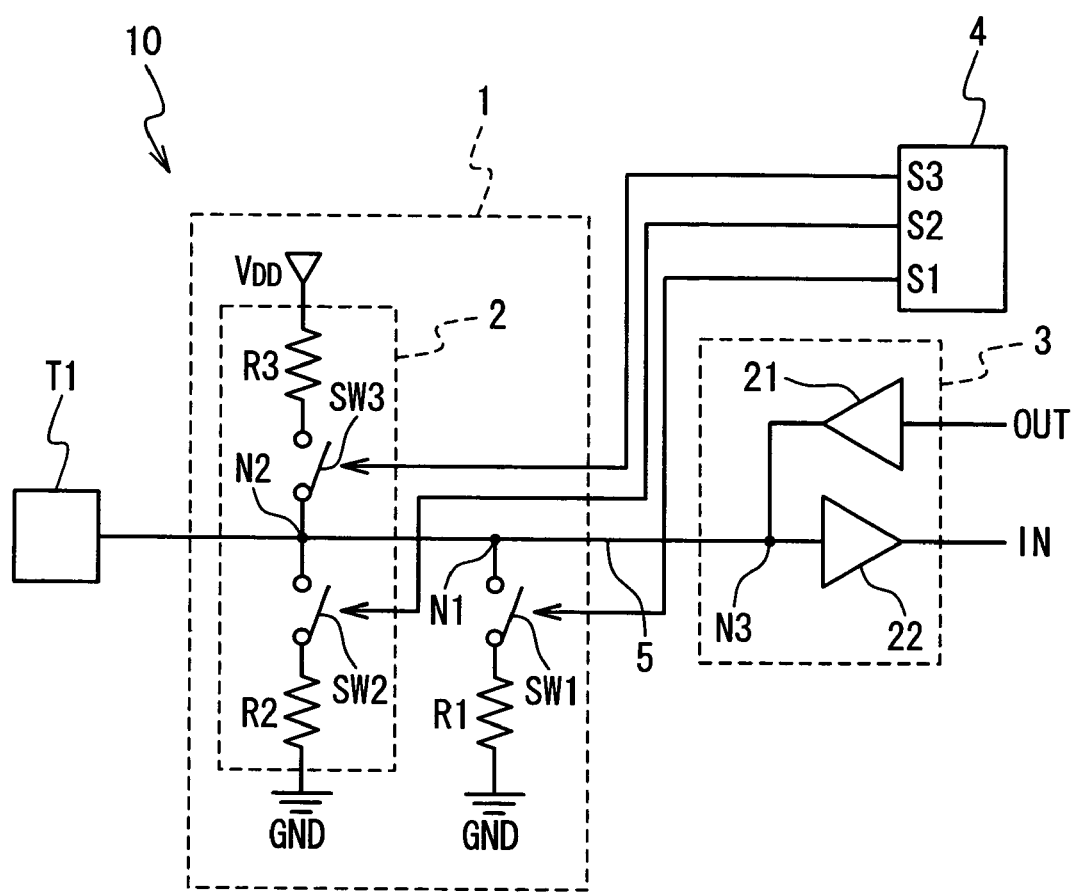
FIG. 2 is a circuit diagram showing the configuration of an input/output circuit according to a first embodiment of the present invention.

FIG. 2 is an input/output circuit 10 containing a termination resistor circuit 1 in the semiconductor device of the present invention. In FIG. 2, T1 is assumed to indicate one of input/output nodes of the semiconductor device such as an LSI as a test target. Also, in the following embodiments, an example where the input/output circuit 10 of the LSI is used as a memory interface will be described. It should be noted that this does not limit the configuration of the semiconductor device with the input/output circuit according to the present invention.

With reference to FIG. 2, the input/output circuit 10 is provided with a termination resistor circuit 1, an input/output buffer circuit 3, a control circuit 4 and the input/output node T1. The input/output buffer circuit 3 is composed of a first buffer 21 and a second buffer 22. An output terminal of the first buffer 21 is connected through a third node N3 to an input of the second buffer 22 and the input/output node T1. When the semiconductor device is used, an input signal is supplied from the input buffer 21 to the input/output node T1 through a signal line 5, and an output signal is outputted from the input/output node T1 to the output buffer 22 through the signal line 5.

With reference to FIG. 2, the termination resistor circuit 1 of the present invention is provided with a Thevenin termination resistor circuit 2, a test resistor R1 and a test switch SW1. Also, the Thevenin termination resistor circuit 2 is composed of a first resistor R2, a first switch SW2, a second resistor R3 and a second switch SW3. The test resistor R1 is connected to the signal line 5 through the test switch SW1. As shown in FIG. 2, the test switch SW1 controls the connection between the test resistor R1 and the signal line 5 in response to a first control signal S1. Preferably, the test resistor R1 functions as a pull-down resistor when the input/output node T1 is in an opened state or a high impedance state. Therefore, the test resistor R1 has a resistance larger enough to stabilize the voltage level of the signal line 5, and to suppress a current flowing out from the first buffer 21 at that time. In particular, in the DDR-II standard, it is ruled that the first resistor R2 or the second resistor R3 has a small resistance such as 75Ω or 150Ω. Therefore, the resistance of the test resistor R1 is preferable to be about 20 to 300 times more than that of the first or second resistor. In short, because the input/output node T1 is a two-way node, the test resistor functions as the pull-down resistor when the input/output node T1 functions as the input node, and functions to set the signal line 5 to the high impedance state when the input/output node T1 functions as the output node. Thus, the resistance of the test resistor is determined based on a level of a signal supplied onto said signal line. In the following embodiments, the resistance of the test resistor R1 is assumed to be several kΩ.

As shown in FIG. 2, the first switch SW2 is connected between a second node N2 on the signal line 5 and the first resistor R2, and the second switch SW3 is connected between the second node N2 and the second resistor R3. The first switch SW2 controls the connection between the second node N2 and the first resistor R2 in response to an input second control signal S2. Similarly, the second switch SW3 controls the connection between the second node N2 and the second resistor R3 in response to an input third control signal S3. Also, in the following embodiments, the resistance of each of the first resistor R2 and the second resistor R3 is assumed to be a value corresponding to the DDR-II standard, e.g., 75Ω.

The control circuit 4 determines whether the semiconductor device is in a test mode or a normal mode, in response to a mode switching command sent from an external unit, and outputs the above control signals S1 to S3 as a mode control signal depending on the determined mode. That is, the control circuit 4 sets the test mode and generates a test start signal in response to a test start command and sets the normal mode and generates a test end signal in response to a test end command. For example, when determining a current mode as the test mode, the control circuit 4 outputs a test start signal. The termination resistor circuit 1 switches the connection state between the signal line 5 and each of the test resistor R1, the first resistor R2, and the second resistor R3 in accordance with the control signal outputted from the control circuit 4. For example, when the first switch SW2 and the second switch SW3 are constituted from P-channel MOS transistors, and the test switch SW1 is constituted from an N-channel MOS transistor, the control circuit 4 outputs the control signals S1 to S3 of a high level as the test start signal. As a result, the termination resistor circuit 1 can be set to the test mode.

Figure 3:
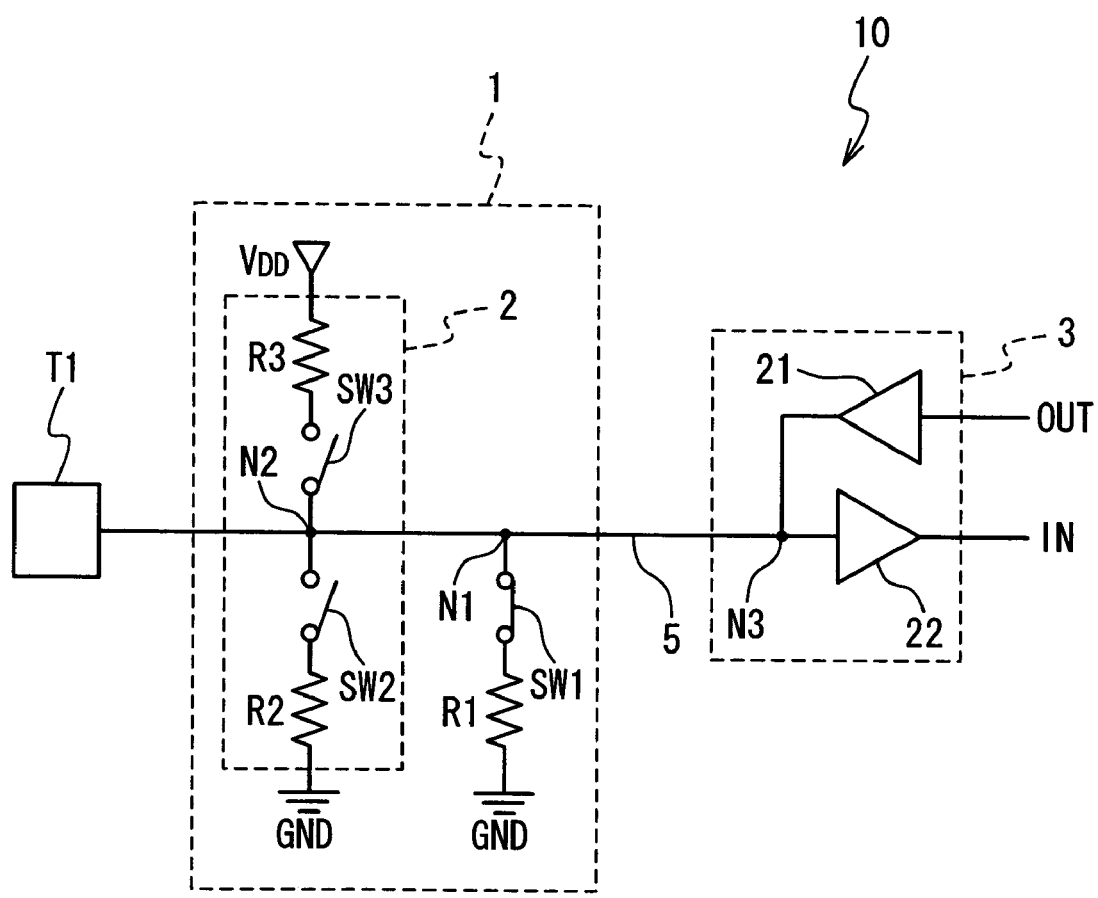
FIG. 3 is a circuit diagram showing the configuration of the input/output circuit in the first embodiment in a test mode.

FIG. 3 is a circuit diagram showing the connection state of the input/output circuit 10 in the test mode. As shown in FIG. 3, in the test mode, the control circuit 4 sets the first switch SW2 and the second switch SW3 to an open state in accordance with the control signals S2 and S3, and sets the test switch SW1 to a close state in accordance with the control signal S1. Thus, the connection state is established such that the input/output node T1 and the test resistor R1 are connected through the first node N1, and the input/output node T1, the first buffer 21 and the second buffer 22 are connected through the third node N3. Therefore, the test resistor R1 is connected between the first node N1 and the ground line GND in the test mode.

At this time, it is supposed that any test terminal of an LSI tester (not shown) and the input/output node T1 are not connected. Depending on a test pattern used for the test, the input/output node T1 functions as an input node or output node. Regardless of that the input/output node T1 functions as the input node in this case, the signal line 5 can be set to the ground level in the termination resistor circuit 1, by connecting the test resistor R1 to the signal line 5, even when the input/output node T1 is not connected to the test terminal as mentioned above. Therefore, the termination resistor circuit 1 can stabilizes the voltage level of the signal line 5 by the test resistor R1 connected to the signal line 5. Also, when the LSI test is carried out under the assumption that the input/output node T1 functions as the output node, the termination resistor circuit 1 suppresses the current from flowing from the first buffer 21 into the ground line through the connection between the test resistor R1 and the signal line 5.

Figure 4:
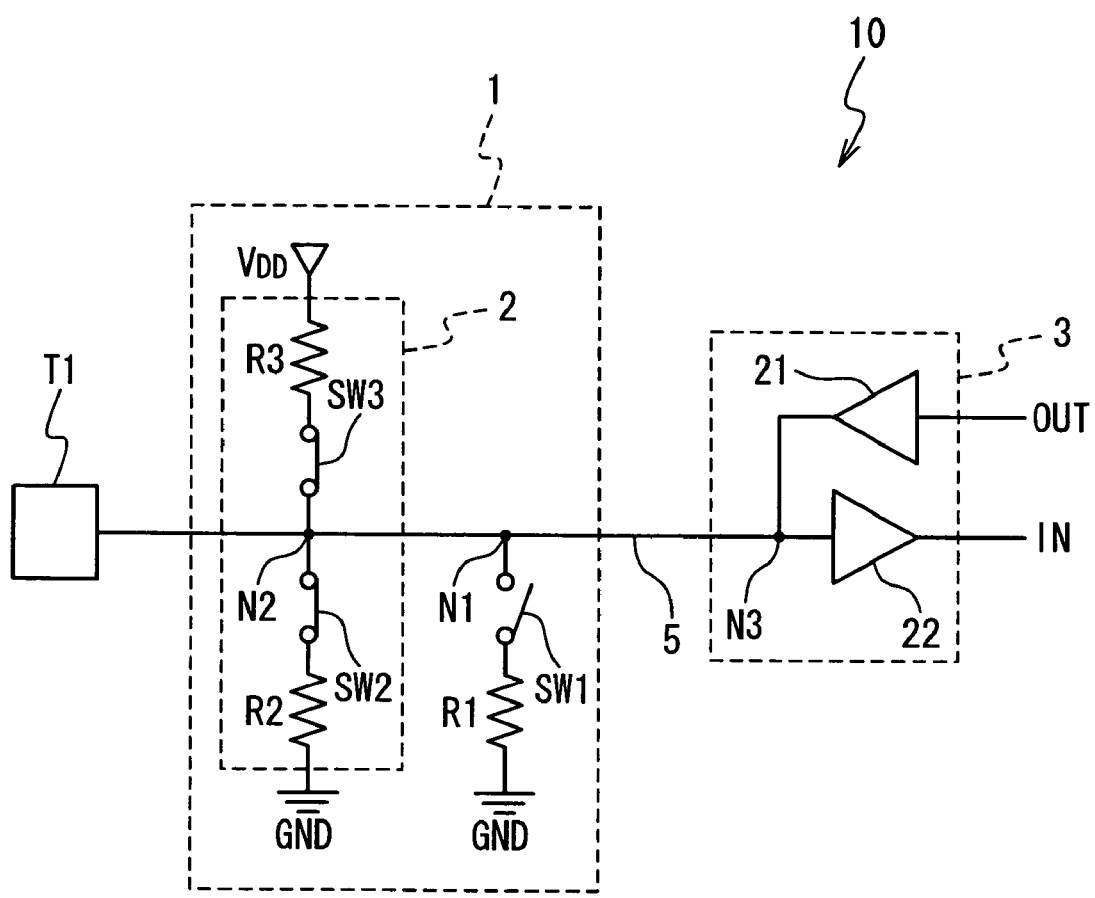
FIG. 4 is a circuit diagram showing a configuration of the input/output circuit 10 in the first embodiment in a normal mode.

FIG. 4 is a circuit diagram showing the connection state of the input/output circuit 10 in this embodiment in the normal mode. The control circuit 4 generates and outputs the control signals S1 to S3 as a test end signals in response to the mode switching command sent from the external unit. As shown in FIG. 4, in the normal mode, the termination resistor circuit 1 closes the first switch SW2 and the second switch SW3 in response to the control signals S2 and S3 as the test end signal outputted from the control circuit 4. At this time, since the test switch SW1 is opened in response to the control signal S1 of the test end signal, the test resistor R1 and the signal line 5 are disconnected. Since the first switch SW2 and the second switch SW3 are closed, the termination resistor circuit 2 constitutes the normal Thevenin termination resistor circuit. At that time, since the test resistor R1 and the signal line 5 are not connected, the input/output circuit 10 can constitute the termination resistor circuit 1 corresponding to the DDR-II standard.

Figure 5:
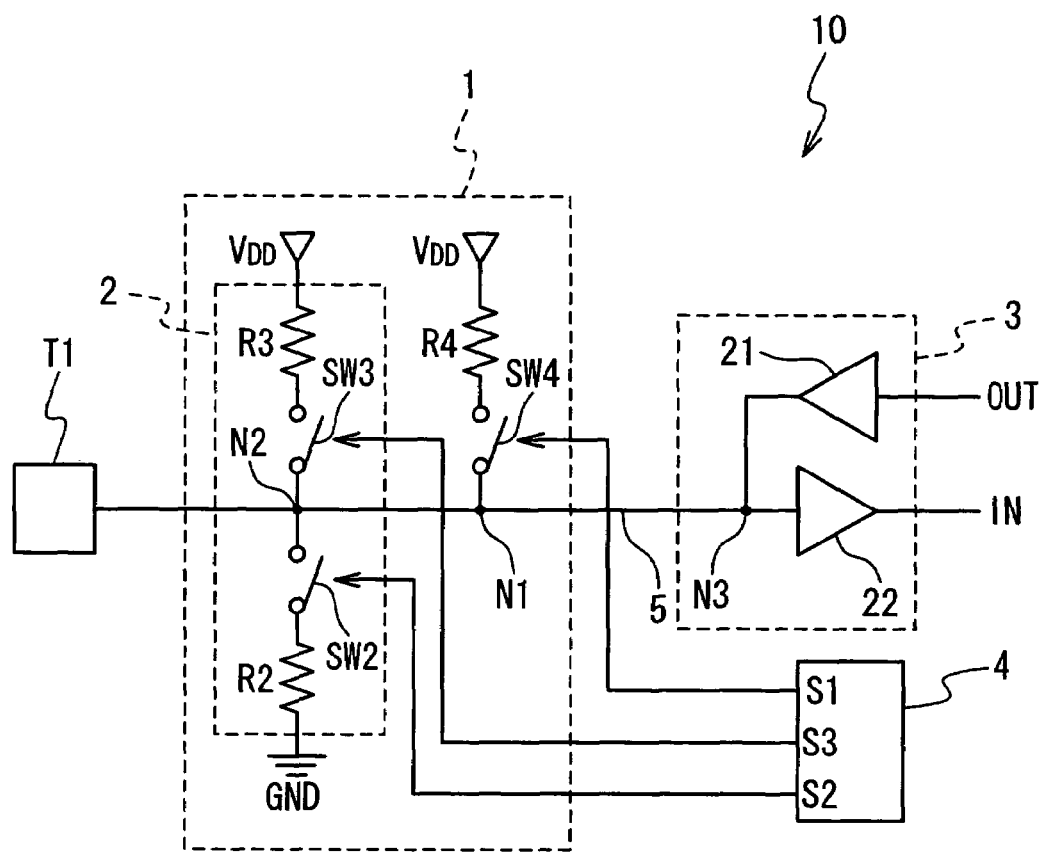
FIG. 5 is a circuit diagram showing the configuration of the input/output circuit according to a second embodiment of the present invention.

FIG. 5 is a circuit diagram showing the configuration of the input/output circuit 10 according to the second embodiment of the present invention. With reference to FIG. 5, the input/output circuit 10 in the second embodiment is also provided with the termination resistor circuit 1, the input/output buffer circuit 3, the control circuit 4 and the input/output node T1. As shown in FIG. 5, the termination resistor circuit 1 is provided with the Thevenin termination resistor circuit 2, a test resistor R4 and a test switch SW4. The input/output circuit 10 shown in FIG. 5 closes the test switch SW4 in response to the control signal S1 in the test mode. Therefore, the test resistor R4 fixes or pulls up the level of the signal line 5 to a power source voltage at the time of the LSI test. Therefore, when the input/output node T1 is not connected to the test terminal, the level of the signal line 5 can be adjusted to the power source voltage even if the LSI test is carried out under the assumption that the input/output node T1 functions as the input node.

The termination resistor of the input/output circuit 10 is configured as mentioned above. Thus, even if the input/output terminal is not connected to the LSI tester at the time of the LSI test, the level of the signal line 5 can be stabilized. Also, when the test is carried out under the assumption that the input/output node T1 functions as the output node, the output impedance is greatly lower than the resistance of the test resistor R1. Therefore, the Thevenin termination resistor circuit 2 can regards that the test resistor R1 is not connected, like the first embodiment.

Since the test resistor R1 or test resistor R4 is provided, it is not necessary to carry out the complex control in which both of the first resistor R2 and the second resistor R3 are disconnected from the signal line 5 in the output mode, and the first resistor R2 is connected to the signal line 5 and the second resistor R3 is disconnected from the signal line 5 in the input mode, even when the input mode and the output mode are complexly switched in the input/output circuit. Thus, without using the complex test pattern, it is possible to carry out the LSI test, to reduce the time for the LSI test and the cost of the LSI test. Also, it is possible to reduce the time required to prepare a test program.

Moreover, the provision of the test resistor R1 protects the excessive current from flowing out from the Thevenin termination resistor circuit 2. Thus, the power consumption related to the LSI test can be decreased. Also, while the LSI tester is conventionally required whose test terminals are connected with all of the input/output nodes T1 of the large-scaled LSI, such an LSI tester is not required in the present invention. Therefore, the manufacturing cost of the LSI can be reduced greatly. Also, even if the LSI tester is used in the present invention, the termination resistor circuit 1 of the present invention has no influence on the test operation. Therefore, even if any LSI tester is used, the moderate test result can be obtained.

Figure 1:
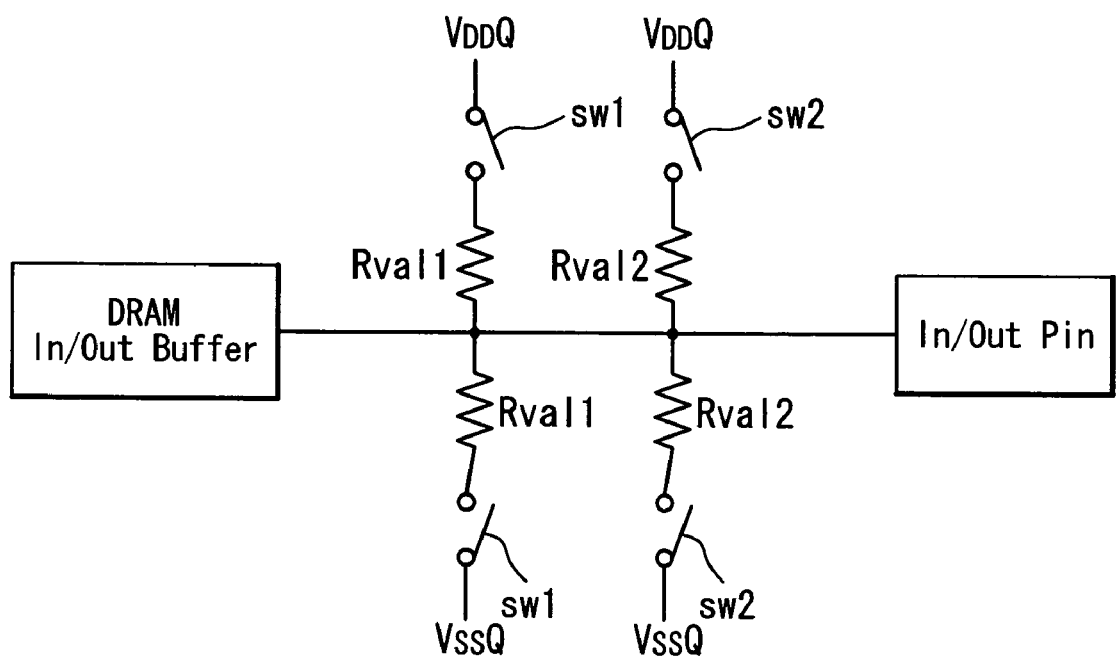
FIG. 1 is a circuit diagram showing a configuration of a conventional input/output circuit.

It should be noted that in the above-mentioned embodiments, a single Thevenin termination resistor circuit is provided in the termination resistor circuit 1. However, the present invention is not limited to such a termination resistor circuit 1. For example, the Thevenin termination resistor circuit 2 may have the circuit configuration as shown in FIG. 1. In such a case, the present invention can sufficiently exhibit the effect.

According to the present invention, at the time of the LSI test, the voltage level of the input/output node in the input mode can be made stable, even if the input/output node is not connected to the test terminal of the LSI tester. Also, in that case, the penetration current in the output mode can be decreased.

What is claimed is:

1. A semiconductor device comprising:
a signal line connected with an input/output node of said semiconductor device;
a test load circuit comprising a test resistor provided between said signal line and a first power line, the test load circuit to connect said signal line to said first power line through said test resistor in response to a test start signal; and
a termination circuit comprising first and second resistors, the termination circuit provided between said first power line and a second power line, the termination circuit configured to disconnect said signal line from said first and second power lines in response to said test start signal.

2. The semiconductor device according to claim 1, wherein said test load circuit disconnects said signal line from said first power line in response to a test end signal, and
wherein said termination circuit connects said signal line with said first and second power lines through said first and second resistors in response to said test end signal.

3. The semiconductor device according to claim 2, further comprising:
a control circuit configured to set a test mode in response to a test start command to generate said test start signal, and to set a normal mode in response to a test end command to generate said test end signal.

4. The semiconductor device according to claim 3, wherein a resistance of said test resistor is larger than that of each of said first and second resistors.

5. The semiconductor device according to claim 3, wherein a resistance of said test resistor is determined based on a level of a signal supplied onto said signal line.

6. The semiconductor device according to claim 5, further comprising an input/output buffer circuit, wherein said input/output buffer circuit outputs said signal from an external unit onto said signal line and outputs a signal onto said signal line to said external unit in said test mode.

7. The semiconductor device according to claim 1, wherein a resistance of said test resistor is larger than that of each of said first and second resistors.

8. The semiconductor device according to claim 2, wherein said test load circuit comprises:
said test resistor; and
a test switch configured to connect said signal line to said first power line through said test resistor in response to said test start signal.

9. The semiconductor device according to claim 2, wherein said termination circuit comprises:
said first and second resistors;
a first switch configured to connect said signal line to said first power line through said first resistor in response to said test start signal, and to disconnect said signal line from said first power line in response to said test end signal; and
a second switch configured to connect said signal line to said second power line through said second resistor in response to said test start signal, and to disconnect said signal line from said second power line in response to said test end signal.

10. A method of testing a semiconductor device, comprising:
connecting a signal line, which is connected with an input/output node of said semiconductor device, to a first one of power lines through a test resistor of a test load circuit in response to a test start signal; and
disconnecting said signal line from said first power line and a second power line by a termination circuit having first and second resistors, in response to said test start signal.

11. The method according to claim 10, further comprising:
disconnecting said signal line from said first power line in response to a test end signal; and
connecting said signal line with said first and second power lines through said first and second resistors in response to said test end signal, respectively.

12. The method according to claim 11, further comprising:
setting a test mode and generating said test start signal in response to a test start command; and setting a normal mode and generating said test end signal in response to a test end command.

13. The method according to claim 12, wherein a resistance of said test resistor is larger than that of each of said first and second resistors.

14. The method according to claim 12, wherein a resistance of said test resistor is determined based on a level of a signal supplied onto said signal line.

15. The method according to claim 14, further comprising:
outputting said signal from an external unit onto said signal line through an input/output buffer circuit in said test mode; and
outputting a signal onto said signal line said to said external unit through said input/output buffer circuit in said test mode.

16. The method according to claim 10, wherein a resistance of said test resistor is larger than that of each of said first and second resistors.

17. The method according to claim 11, wherein said connecting of said signal line to said first one of power lines through said test resistor comprises closing a test switch provided between said signal line and said first power line in response to said test start signal, and
wherein said disconnecting said signal line from said first power line in response to a test end signal comprises opening said test switch in response to said test end signal.

18. The method according to claim 11, wherein said disconnecting said signal line from said first power line and said second power line comprises opening a first switch provided between said signal line and said first power line and a second switch provided between said signal line and said second power line in response to said test start signal, and
wherein said connecting said signal line from said first power line and said second power line in response to said test end signal comprises closing said first switch and said second switch in response to said test end signal.

19. A semiconductor device, comprising:
a signal line configured to associate with an input/output node of the semiconductor device;
a control unit configured to transmit a test start signal and a test end signal;
a first node to associate with the signal line;
a test load circuit associated with the first node, the test load circuit comprising:
a test resistor provided between the first node and a test voltage source; and
a test switch configured to connect the test resistor with the first node when the test switch receives the test start signal from the control unit;
a second node to associate with a signal line;
a termination circuit to associate with the second node, the termination circuit comprising:
a first resistor provided between a first voltage source and the second node;
a second resistor provided between a second voltage source and the second node;
a first switch configured to connect the first resistor to the second node when the first switch receives the test end signal from the control unit and to disconnect the first resistor from the second node when the first switch receives the test start signal from the control unit; and
a first switch configured to connect the first resistor to the second node when the first switch receives the test end signal from the control unit and to disconnect the first resistor from the second node when the first switch receives the test start signal from the control unit.

20. The semiconductor device of claim 19, wherein the input/output node comprises a two-way node;
wherein the test resistor comprises a pull-down resistor when the input/output node functions as an input node; and
wherein the test resistor operates at a high impedance state when the input/output node functions as an output node.

* * * * *